(12) United States Patent
Ma

(10) Patent No.: US 7,160,130 B2
(45) Date of Patent: Jan. 9, 2007

(54) LAND GRID ARRAY PACKAGE SOCKET

(75) Inventor: Hao-Yun Ma, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/318,798

(22) Filed: Dec. 27, 2005

(65) Prior Publication Data

US 2006/0141840 A1    Jun. 29, 2006

(30) Foreign Application Priority Data

Dec. 24, 2004    (TW) .............................. 93220821 U

(51) Int. Cl.
*H01R 13/62*    (2006.01)
(52) U.S. Cl. ..................................... 439/331
(58) Field of Classification Search ................. 439/73, 439/331
See application file for complete search history.

(56) References Cited

U.S. PATENT DOCUMENTS 6,929,495 B1 *    8/2005    Ma ............................. 439/331

\* cited by examiner

*Primary Examiner*—Tho D. Ta
(74) *Attorney, Agent, or Firm*—Wei Te Chung

(57) ABSTRACT

An LGA socket (10) includes a socket body (30) having a number of terminals (40), a stiffener (50) attached to the socket body, and a load plate (60) and a load lever (70) pivotally mounted to two ends of the stiffener, respectively. The load plate defines a pair of pivotal portions (602) mounted to the stiffener to enable the load plate to rotate between an open position and a closed position. Each pivotal portion includes a bearing tongue (603) and a stopper (604). The stopper resists against the stiffener for preventing the load plate from moving relative to the socket body in a horizontal direction.

9 Claims, 4 Drawing Sheets

LAND GRID ARRAY PACKAGE SOCKET

BACKGROUND OF THE INVENTION

1. Field of the Invention

The present invention generally relates to the art of electrical connectors and, more particularly, to a land grid array (LGA) socket to provide electrical connection between an LGA package and an electrical substrate, such as a printed circuit board (PCB).

2. Background of the Invention

Integrated circuit packages are generally classified as pin grid array (PGA) packages, ball grid array (BGA) packages and land grid array (LGA) packages depending on the shape of contacting section of the terminals. An integrated circuit package with conductive pads arranged on a bottom surface thereof in a land grid array is known as an LGA package.

Connectors for removably connecting an LGA package with a PCB are known as LGA sockets. Basically, an LGA socket includes a socket body and a plurality of terminals embedded in the socket body. Each terminal has a contacting section and an opposite connecting section. Under compression, the contacting section of the terminal is resiliently deflected from its natural state and electrically registered with a conductive pad on the LGA package. Thus, a flow of electrical signals is established between the LGA package and the PCB.

For example, typically, an LGA socket includes a socket body having a plurality of terminals, a metallic stiffener attached to the socket body, and a load plate and a load lever pivotally assembled to opposite ends of the stiffener, respectively. While the load plate is actuated to press on the LGA package, the load plate will move in a direction away from the load lever, which will cause the LGA package to slide relative to the socket body. The movement of the LGA package will cause the terminals to be offset relative to electrical pads defined on the LGA package. As a result, normal electrical connection between the socket and the LGA package is damaged.

Therefore, there is a heretofore unaddressed need in the industry to address the aforementioned deficiencies and inadequacies.

SUMMARY OF THE INVENTION

In a preferred embodiment of the present invention, an LGA socket includes a socket body having a number of terminals, a stiffener attached to the socket body, and a load plate and a load lever pivotally mounted to two ends of the stiffener, respectively. The load plate defines a pair of pivotal portions mounted to the stiffener to enable the load plate to rotate between an open position and a closed position. Each pivotal portion includes a bearing tongue and a stopper. The stopper resists against the stiffener for preventing the load plate from moving relative to the socket body in a horizontal direction.

Other features and advantages of the present invention will become more apparent to those skilled in the art upon examination of the following drawings and detailed description of preferred embodiment, in which:

DETAILED DESCRIPTION OF THE PREFERRED EMBODIMENT

Reference will now be made to describe the preferred embodiment of the present invention in detail.

Figure 1:
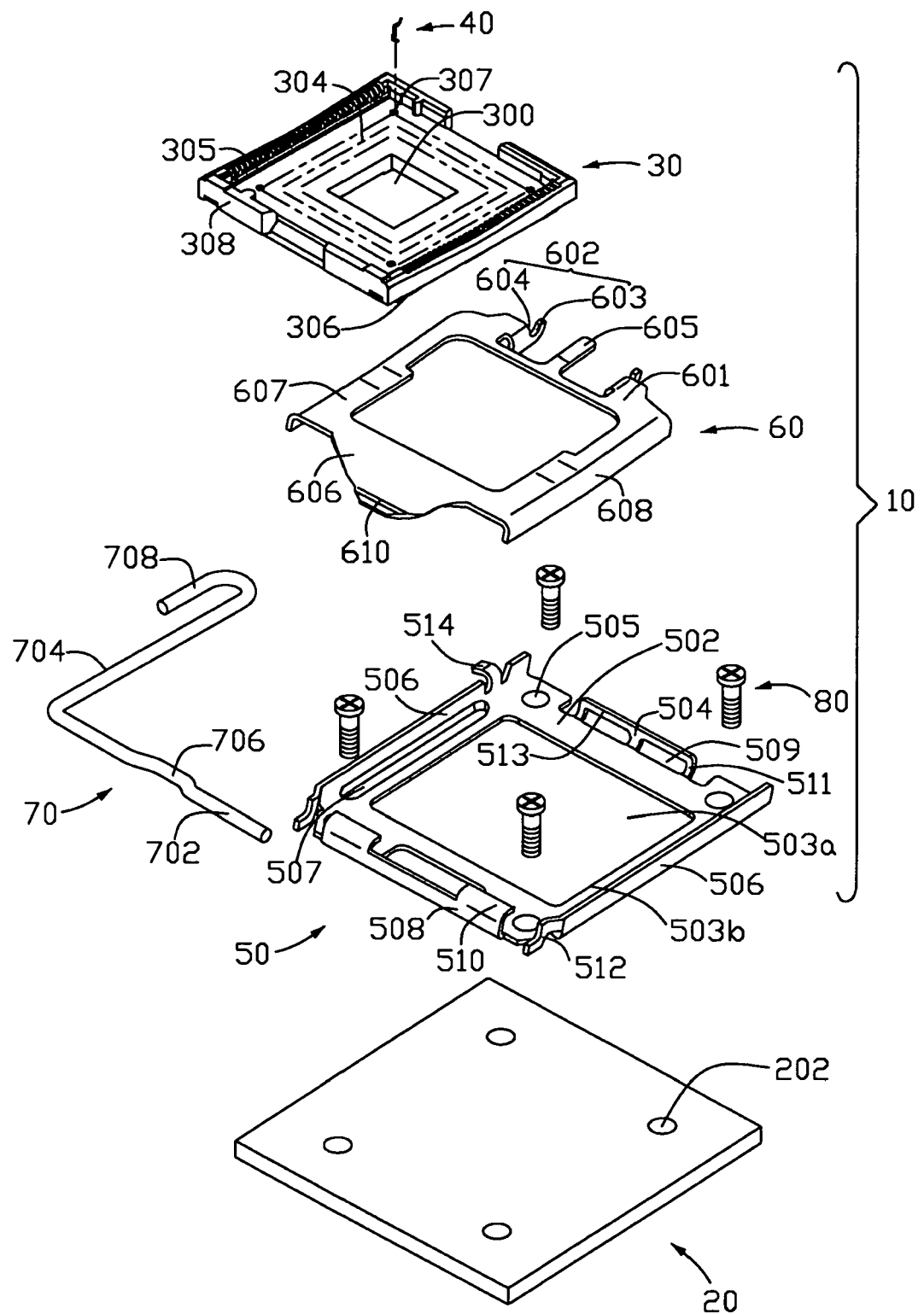
FIG. 1 depicts an exploded, isometric view of an LGA socket in accordance with a preferred embodiment of the present invention.
Figure 3:
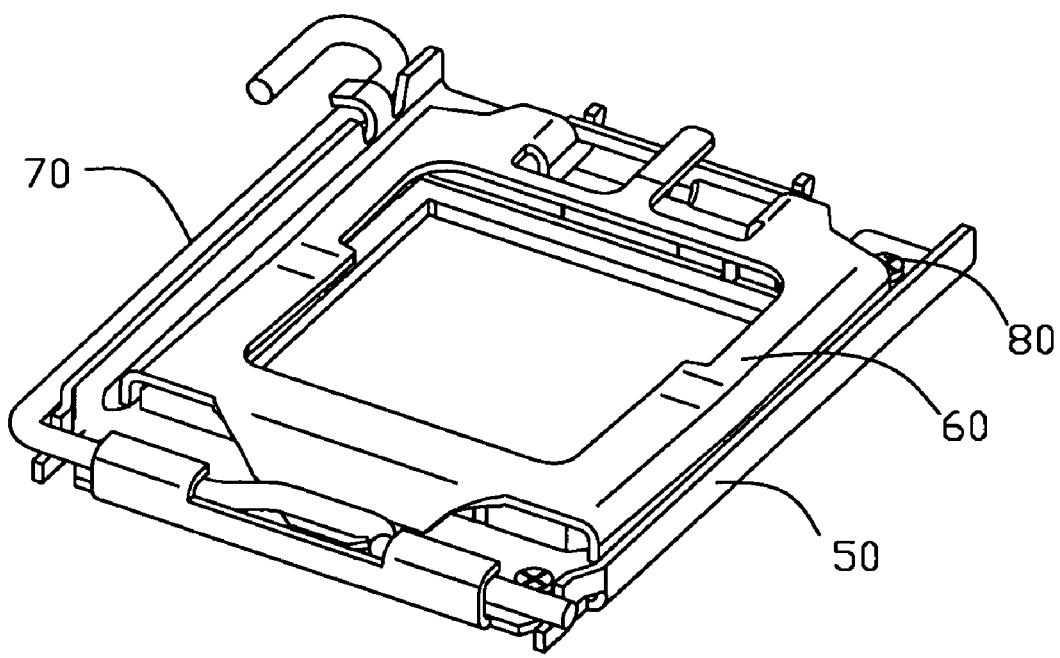
FIG. 3 depicts an assembled, isometric view of the LGA socket of FIG. 1.

As shown in FIG. 1 and FIG. 3, an LGA socket 10 (hereinafter, simply referred to as "socket") in accord with a preferred embodiment of the present invention is used to establish electrical connection between an LGA package (not shown) and an electrical substrate, such as a PCB 20. The socket 10 includes a socket body 30 embedded with a plurality of terminals 40. A stiffener 50 is attached to the socket body 30. A load plate 60 is pivotally mounted on one end of the stiffener 50. A load lever 70 is pivotally supported on an opposite end of the stiffener 50.

Individual elements of the socket 10 will now be described in greater detail. As shown in FIG. 1, the socket body 30 is molded from resin or the like and is shaped in the form of a rectangular frame. A top section of the socket body 30 has an electrical area 304 that is defined by straight peripheral sidewalls 308. The electrical area 304 includes a supporting surface 305 and a mounting surface 306 opposite to the supporting surface 305. A plurality of passageways 307 for receiving the terminals 40 are defined in a matrix pattern throughout the supporting surface 305 and the mounting surface 306.

Each terminal 40 includes a contacting section (not numbered) to be resiliently and electrically mated with a conductive pad on the LGA package and an opposite soldering section (not numbered) to be connected to a circuit pad arranged on the PCB 20.

The stiffener 50 is formed by stamping and bending a single sheet of metal into a rectangular plate. The stiffener 50 includes a planar bottom wall 502. Side edges of the bottom wall 502 are bent upward to form a rear wall 504, a front wall 508 and a pair of lateral walls 506 between the rear wall 504 and the front wall 508.

The bottom wall 502 has a large rectangular opening 503a defined by straight edges 503b. The rectangular opening 503a has a dimension that permits the socket body 30 to press-fit therein. Two pairs of through-holes 505 corresponding to mounting holes 202 defined in the PCB 20 are defined at each corner of the bottom wall 502. The through-holes 505 are symmetrically disposed along a front-rear direction. A pair of slots 507 for partially receiving the load plate 60 is provided at the joints of the bottom wall 502 and the two lateral walls 506. Each of the slots 507 extends along the bottom wall 502 in a front-rear direction.

The front wall 508 includes a pair of generally L-shaped retaining elements 510 that project upward and are bent inward. The retaining elements 510 are spaced apart from one another.

A locking element 514 is formed integrally with one of the lateral walls 506 at a position corresponding to an actuating section 704 of the load lever 70. The downward-facing surface of the locking element 514 is concave to make the load lever 70 hard to remove therefrom when the load lever 70 is engaged with the locking element 514. A pair of shaft-supporting ribs 512 for supporting the load lever 70 is provided at front sides of the lateral walls 506.

A pair of vertical poles 511 is provided at opposite lateral sides of the rear wall 504. A beam 513 parallel to the bottom wall 502 is disposed to connect the vertical poles 511. The beam 513, the vertical poles 511 and the bottom wall 502 jointly define two cavities 509 for receiving bearing tongues 603 of the load plate 60, respectively.

The load plate 60 is formed by stamping and bending a single sheet of metal into a rectangular shape. The load plate 60 includes a joint side 601, a pressing side 606 and a pair of lateral sides 607 disposed between the joint side 601 and the pressing side 606.

The joint side 601 defines a pair of pivotal portions 602. Each pivotal portion 602 includes a bearing tongue 603 and a stopper 604. The pivotal portions 602 are curved downward and spaced apart from one another. A holding element 605 is provided midway between the pivotal portions 602. Generally, the stopper 604 is substantially perpendicular to the socket body 30, and the bearing tongue 603 is generally arc-shaped.

An interlocking element 610 for engaging with the load lever 70 is formed at a middle section of the pressing side 606. The interlocking element 610 projects downward and extends in an outward direction.

Upper surface of the load plate 60 is slightly curved downward so that a force applied on the load plate 60 is transferred uniformly to the LGA package when the load plate 60 presses the LGA package against the socket 10. Edges of the lateral sides 607 are bent downward to form blocking walls 608.

The load lever 70 is formed by bending a single metallic wire and includes a pair of rotary shafts 702 which are spaced apart from one another. A locking section 706 is disposed between the rotary shafts 702 and is displaced relative to the rotary shafts 702. An actuating section 704 for rotating the rotary shafts 702 is bent at a right angle with respect to the rotary shafts 702. A distal end of the actuating section 704 is formed into a U-like shape in order to form a handle 708 for ease of actuation.

Figure 2:
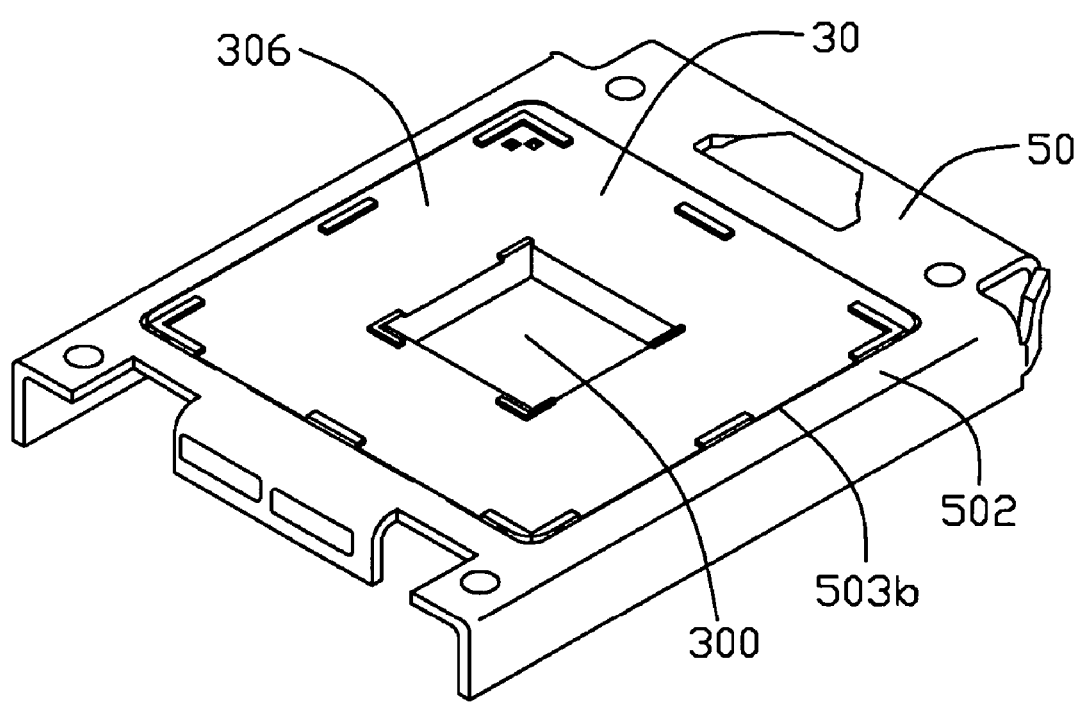
FIG. 2 depicts a bottom view of a stiffener shown in FIG. 1, wherein a socket body is engaged with the stiffener.

Assembly of the socket 10 will now be described in greater detail. As shown in FIG. 1, FIG. 2 and FIG. 3, the pivotal portions 602 of the load plate 60 are inserted into the cavities 509 of the rear wall 504. The bearing tongues 603 are pivotally disposed around the beam 513, and the stopper 604 resists against the beam 513. The holding element 605 is rest on the beam 513 to prevent the load plate 60 from falling out of the rear wall 504. The load lever 70 is pivotally secured in position via the shaft-supporting ribs 512 and the retaining elements 510 of the stiffener 50. By virtue of the cooperation of the stopper 604 and the beam 513, the load plate is prevented form moving relative to the socket body 30 in a horizontal direction.

Referring to FIG. 2, the socket body 30 embedded with terminals 40 is press-fitted into the large rectangular opening 503a. The straight peripheral sidewalls 308 are engaged with the straight edges 503b of the large rectangular opening 503a. The mounting surface 306 of the socket body 30 protrudes beyond the bottom wall 502 of the stiffener 50 slightly.

In assembly, the socket body 30 is engaged with the stiffener 50 and no riveting or heating process is needed. Therefore, the assembly procedure of the socket 10 is simplified and the socket body 30 is free from warping. Additionally, the socket body 30 is easy to be disassembled from the stiffener 60 in case the terminals 40 or the socket body 30 is damaged during assembly.

Figure 4:
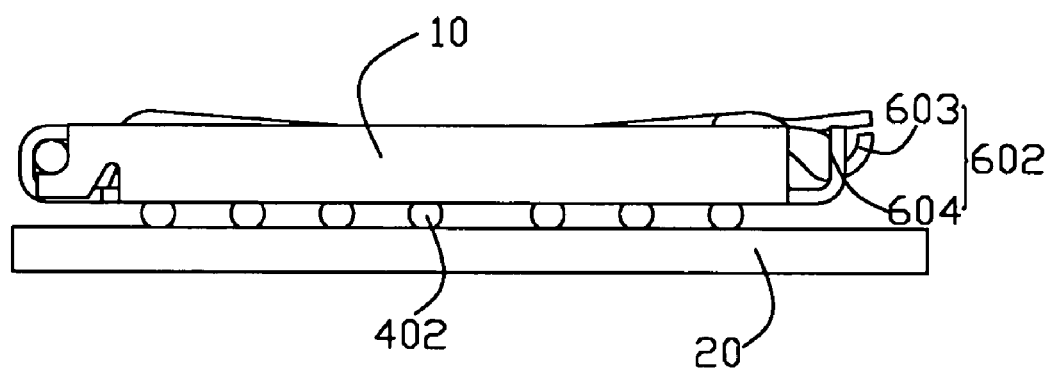
FIG. 4 depicts a side view of the LGA socket of FIG. 3, wherein the stiffener of the LGA socket is fastened to a PCB via a plurality of bolts.

As best shown in FIG. 3 and FIG. 4, prior to the soldering process, the socket 10 is rested on the PCB 20. The through-holes 505 and the soldering balls 402 are registered with the mounting holes 202 and the circuit pads of the PCB 20, respectively. After the soldering process, the bolts 80 are inserted into the through-holes 505 and the mounting holes 202 in order and tightened to the PCB 20. When the tightening force exerted on the bolts 80 is strong enough to overcome the engagement between the socket body 30 and the stiffener 50, the stiffener 50 disengages from the socket body 30 and moves downward to the PCB 20.

The bolts 80 not only strengthens the PCB 20, but also prevents the socket 10 from departing from the PCB 20 under extreme shock or vibration at a sudden. Moreover, the soldering balls 402 disposed on the terminals 40 are free from disconnecting from the circuit pads on the PCB 20.

It should be understood that the socket body 30 may be attached to the stiffener 50 in other manners. For example, in an alternative form, the socket body 30 is designed to have an inverted pyramid shape. Prior to setting the socket 10 to the PCB 20, the stiffener 50 is engaged with upper section of the socket body 30. In course of setting the socket 10 to the PCB 20, the stiffener 50 is disengaged from the socket body 30 and slides down to lower section of the socket body 30.

In still another alternative form, the socket body 30 is configured to a T-shaped estrade including an upper horizontal section and a lower vertical section. Prior to setting the socket 10 to the PCB 20, bottom surface of the upper horizontal section is seated on the bottom wall 502 of the stiffener 50. In course of setting the socket 10 to the PCB 20, the stiffener 50 is departed from the upper horizontal section and moves down to the lower vertical section.

Referring to FIG. 3 and FIG. 4, operation of the socket 10 will now be described in greater detail. The actuating section 704 of the load lever 70 is released so that the locking section 706 is disengaged from the interlocking element 610 of the load plate 60, and the load plate 60 is positioned in an open position. The LGA package is placed on the electrical area 304. The load plate 60 is pivoted to a closed position and is locked by the locking section 706. The actuating section 704 is driven to lower the locking section 706, which in turn presses downward on the load plate 60. When the load plate 60 is closed, the conductive pads on the LGA package are brought into contact with terminals 40 embedded in the socket body 30. The blocking walls 608 of the load plate 60 are partially situated in the slot 507. The bolts 80 are located at outer sides of the load plate 60.

It should be noted that the stiffener 50 of the present invention still can be fastened to the PCB 20 via other fastening means, such as screws and board locks, on condition that the joint between the fastening means and the PCB 20 is strong enough.

While the present invention has been described with reference to a specific embodiment, the description of the invention is illustrative and is not to be construed as limiting the invention. Various of modifications to the present invention can be made to the preferred embodiment by those skilled in the art without departing from the true spirit and scope of the invention as defined by the appended claims.

What is claimed is:

1. A land grid array package socket for electrically connecting a land grid array package, comprising:
   a socket body equipped with a plurality of terminals;
   a stiffener having a bottom wall separably disposed around the socket body;

a load plate pivotally mounted on one end of the stiffener, the load plate being pivotal between an open position and a closed position; and a load lever pivotally supported on other end of the stiffener for locking the load plate in the closed position; wherein the load plate defines a pair of pivotal portions curved downward and spaced apart from one another, and each pivotal portion defines a bearing tongue and a stopper, the stopper resisting against the stiffener for prevent the load plate from moving relative to the socket body in a horizontal direction;

wherein the stopper is substantially perpendicular to the socket body.

2. The land grid array package socket of claim 1, wherein the socket body comprises a plurality of straight peripheral sidewalls, and the bottom wall of the stiffener defines a rectangular opening permitting the socket body to be press-fitted therein.

3. A land grid array package socket, comprising:

a socket body equipped with a plurality of terminals;

a stiffener having a bottom wall separably disposed around the socket body;

a load plate pivotally mounted on one end of the stiffener, the load plate being pivotal between an open position and a closed position; and a load lever pivotally supported on other end of the stiffener for locking the load plate in the closed position; wherein the load plate defines a pair of pivotal portions curved downward and spaced apart from one another, and each pivotal portion defines an arc-shaped portion and a vertical portion, the vertical portion resisting against the stiffener.

4. The land grid array package socket of claim 3, wherein the socket body comprises a plurality of straight peripheral sidewalls, and the bottom wall of the stiffener defines a rectangular opening permitting the socket body to be press-fitted therein.

5. A land grid array package socket comprising:

an insulative housing;

a plurality of terminals disposed in the insulative housing;

a stiffener surrounding the insulative housing; and a load plate defining a bearing section engaged with one end of the stiffener for guiding pivotal movement of the load plate relative to the stiffener, the load plate being pivotal between an open position and a closed position; and a load lever pivotally supported on other end of the stiffener for locking the load plate in the closed position; wherein said bearing section is essentially located in a plane with an engagement edge to engage with said end of the stiffener;

wherein said plane extends in a vertical manner;

wherein the load plate further includes a stopper section which is essentially located in the same plane with the bearing section.

6. The land array grid package socket as claimed in claim 5, wherein said stopper defies an engaging edge to abut against said end of the load plate.

7. The land array grid package socket as claimed in claim 6, wherein said engaging edge essentially extends in a vertical direction when said load plate is in a locked position relative to the stiffener.

8. The land array grid package socket as claimed in claim 5, wherein said bearing section is connected to a main portion of the load plate via said stopper section.

9. The land array grid package socket as claimed in claim 8, wherein said stopper section is downwardly bent from the main portion of the load plate which essentially extends in a horizontal manner.

* * * * *